United States Patent
Laczko, Sr.

(10) Patent No.: US 6,230,270 B1
(45) Date of Patent: *May 8, 2001

(54) INTEGRATED CIRCUIT IDENTIFICATION SYSTEM

(75) Inventor: Frank L. Laczko, Sr., Allen, TX (US)

(73) Assignee: Texas Instruments Incorporated, Dallas, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/002,464

(22) Filed: Jan. 2, 1998

Related U.S. Application Data

(60) Provisional application No. 60/034,600, filed on Jan. 3, 1997.

(51) Int. Cl.[7] .............................. G06F 11/30; G06F 12/14; H04L 9/00; H04L 9/32
(52) U.S. Cl. ......................... 713/200; 327/149; 327/151; 327/153; 348/180; 348/476; 348/525
(58) Field of Search .................... 377/28, 20; 348/525, 348/476, 180; 327/149, 151, 153; 340/825.25; 713/200

(56) References Cited

U.S. PATENT DOCUMENTS

| | | | |
|---|---|---|---|
| 3,952,253 | * | 4/1976 | DeVolpi et al. ............. 328/63 |
| 5,097,490 | * | 3/1992 | Hulsing, II et al. ............. 377/28 |

\* cited by examiner

*Primary Examiner*—Rupal Dharia
(74) *Attorney, Agent, or Firm*—Gerald E. Laws; W. James Brady, III; Frederick J. Telecky, Jr.

(57) ABSTRACT

An improved integrated circuit including decryption functions employs a method for determining if its environment has been modified, by providing a first VCXO as part of the integrated circuit, providing a second VCXO, adjusting one of the VCXOs in a first preselected manner, determining a first frequency count of the adjusted VCXO during a first preselected time interval using the other VCXO, adjusting the one of the VCXOs in a second preselected manner, determining a second frequency count of the adjusted VCXO during the first preselected time interval using the other VCXO, averaging the first and second frequency count to provide an average frequency count, adjusting the average frequency count in a predetermined manner, and comparing the adjusted average frequency count to a previously stored, determined, or provided average frequency count to determine if the environment of the integrated circuit has been modified.

19 Claims, 4 Drawing Sheets

SEQUENCE

- DROP START TO RESET CIRCUIT, CLEAR COUNTERS
- RAISE START TO ENABLE 32-BIT COUNTER
- COUNTER STARTS ON NEXT LOW TO HIGH TRANSITION OF 1 Hz GATING SIGNAL
- COUNTER STOPS ON FOLLOWING LOW TO HIGH TRANSITION OF 1 Hz SIGNAL
- DATA RDY GOES ACTIVE, SIGNALLING COMPLETION OF COUNT

INTEGRATED CIRCUIT IDENTIFICATION SYSTEM

This application claims priority under 35 USC 119(e)(1) of provisional application No. 60/034,600, filed Jan. 3, 1997.

FIELD OF THE INVENTION

This invention generally relates to integrated circuit identification systems, and more particularly, to improved circuits and methods for identification systems for integrated circuits.

BACKGROUND OF THE INVENTION

Access control in a set top box, or in any other type of pay-per-view system, is often controlled by encrypting the material, and selectively decrypting the authorized material or program. For some conventional set top box chips, this conditional access/decryption scheme is controlled by a smart card containing the key management and accounting software, and a software application called the "verifier".

The verifier is part of the application software supplied by a set top box manufacturer and by NDC (News Digital Systems); it is NDC which is responsible for the set top box security.

When a set top box manufacturer decides to use a particular decryption chip for their set top box, they have to port the verifier to their specific set top box, and then confirm that none of the final application software interferes with, or defeats the security system. This is often a very painful and expensive process. Expensive to the box manufacturer, and painful to both them and NDC to ensure the security system still works properly.

Further if critical parts of the NDC system become internal to an integrated circuit set top box chip, including the decryption function, NDC still desires a way to identify uniquely the system. Current settop boxes use a small EEPROM in the decryption chip with a unique serial number in it. Unfortunately, embedded EEPROM/flash capability is always process specific and does not shrink or migrate very readily as the decryption chip is shrunk or especially when an ASIC containing other settop box components and the decryption chip is shrunk. One alternative solution is to have a small EEPROM on the settop box system board that contains the serial number. While this approach works fine, it has two disadvantages: 1) the cost of the separate EEPROM, and 2) the ability of an unauthorized user to change the serial number by changing or re-programming the EEPROM.

Although it is important that each settop box IC or ASIC operate in the same manner electrically, it would be beneficial from a cost and security standpoint if the integrated circuit chip or ASIC containing the decryption function could generate a unique serial number.

These and other disadvantages of the prior art are overcome by the present invention, however, and improved methods and apparatus for identification systems for integrated circuits are provided.

SUMMARY OF THE INVENTION

Generally, and in one form of the present invention, an improved IC including decryption functions employs a method for determining if the environment of an integrated circuit has been modified, comprising: providing a first VCXO (voltage controlled crystal oscillator) as part of said integrated circuit, providing a second VCXO, adjusting one of said VCXOs in a first preselected manner, determining a first frequency count of said adjusted VCXO during a first preselected time interval using said other VCXO, adjusting said one of said VCXOs in a second preselected manner, determining a second frequency count of said adjusted VCXO during said first preselected time interval using said other VCXO, averaging said first and second frequency count to provide an average frequency count, adjusting said average frequency count in a predetermined manner, and comparing said adjusted average frequency count to a previously determined average frequency count to determine if the environment of said circuit has been modified.

The present invention provides a method for generating a unique electronic signature/characteristic for an integrated circuit, comprising: providing a first VCXO as part of said integrated circuit, providing a second VCXO, adjusting one of said VCXOs in a preselected manner, and determining said unique electronic characteristic from said adjusted VCXO during a preselected time interval using said other VCXO.

It is an object of the present invention to provide a method that allows a chip from a settop box IC or ASIC design to operate in the same manner electrically and still generate a unique serial number.

It is an object of the present invention to provide a method that allows a chip from a settop box IC or ASIC design to operate in the same manner electrically and still generate a unique serial number based upon variables of the system in which it is located.

These and other objects and advantages of the present invention will become apparent from the following detailed description wherein reference is made to the Figures in the accompanying drawings.

DESCRIPTION OF THE DRAWINGS

A more complete understanding of the present invention may be derived by referring to the detailed description and claims when considered in conjunction with the accompanying drawings in which like reference numbers indicate like features throughout the drawings (unless otherwise indicated), and wherein:

DETAILED DESCRIPTION

Figure 1:
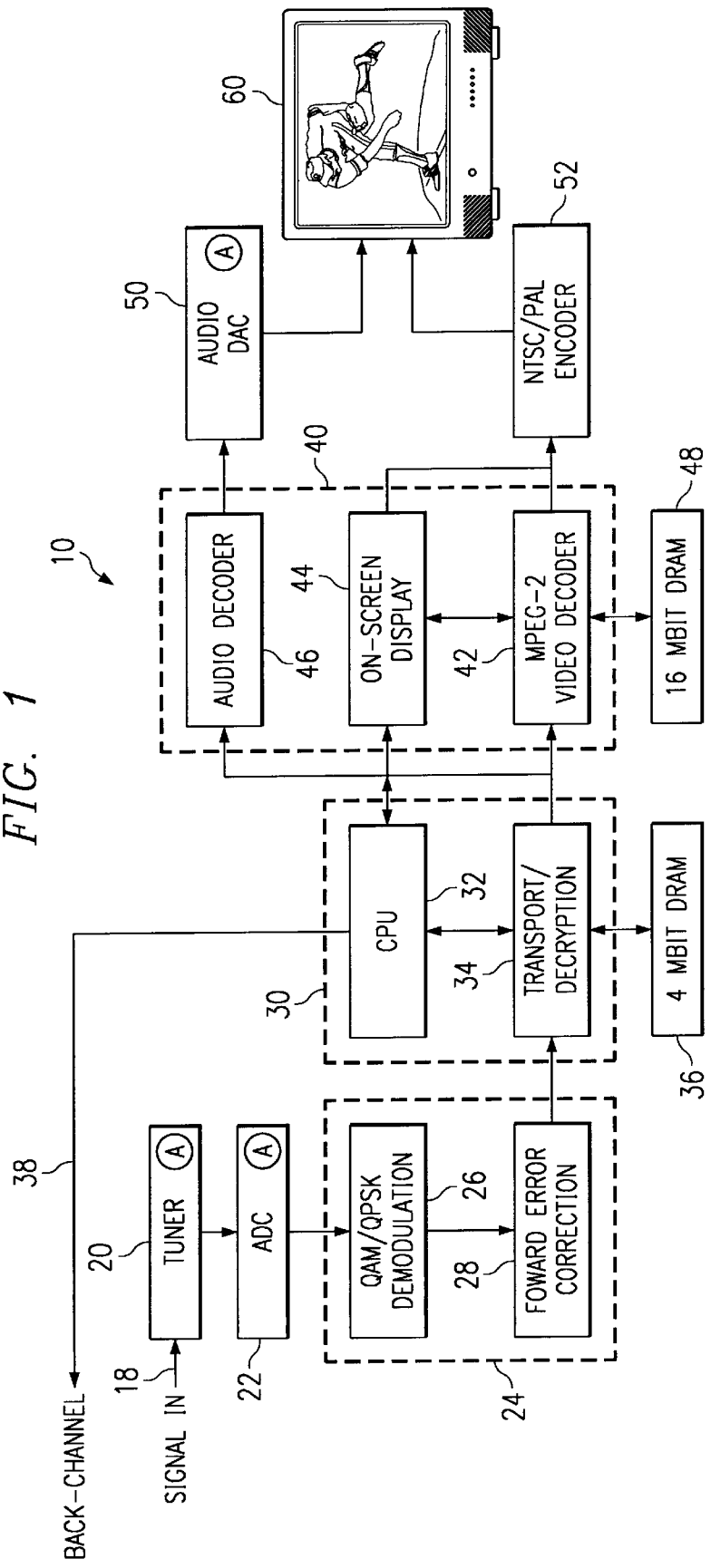
FIG. 1 is a functional block diagram of a settop box employing decryption using the method of the present invention.

FIG. 1 depicts a representative settop box system 10 employing decryption. More particularly, it may be seen that settop box 10 includes many different components. In particular the settop box 10 in FIG. 1 includes an incoming data stream 18 that is provided to a tuner 20 that is typically an analog circuit (as denoted by the circled A in FIG. 1 in this box). The tuner 20 provides its output to an analog-to-digital converter 22 (which is also typically an analog circuit). The output of the ADC 22 is provide as an input to an integrated circuit ("IC") 24.

Typically, IC 24 includes a demodulation block 26 and a forward error correction block 28. These blocks perform their appropriate functions to extract a signal and correct detected errors. The output from the forward error correction block 28 is provided as an input to another IC 30.

Typically, IC 30 includes a transport/decryption block 34 and a CPU block 32. A memory 36 is associated with and connected to this IC 30 and may be used by either of or both of the blocks within IC 30. The transport/decryption block 34 separates the input data stream into the desired video/audio data stream(s), or other type of data stream(s), and if necessary and authorized decrypts any encoded data stream. The CPU 32 is connected to the transport/decryption block 34 and may in some settop boxes control the operation of this block 34 in addition to the other blocks to which it is connected (blocks 42, 44, and 46 in FIG. 1). CPU 32 also may provide a back channel 38. The output of the block 34 is provided as an input to another IC 40.

Typically, IC 40 includes a video decoder block 42, an on-screen display block 44 and an audio decoder block 46. A memory 48 is associated with and connected to this IC 40 and may be used by any of the blocks within IC 40. The video decoder block 42 decodes the incoming digital data stream and provides digital video stream as an output. Similarly, the audio decoder block 46 decodes the incoming digital data stream and provides a digital audio stream as an output. On-screen display block 44 decodes the incoming digital data stream and may provide an independent digital video stream (such as a window or window-in-a-window display) as an output.

The output digital audio stream is input to an audio DAC 50 (which is also typically an analog circuit). The output digital video stream is input to an NTSC/PAL encoder 52. The outputs of blocks 50 and 52 are provided to television 60, or other type of display device, to reproduce the decoded audio and video signals.

For some settop boxes the ICs 30 and 40 may be integrated onto a single chip and for others ICs 30, 40 and 52 may be integrated onto a single chip.

It is desirable to have all IC's of a particular settop box 10 design act identically electrically, while still being able to uniquely identify the environment or system the IC or chip is operating in. In this way when chips are removed from a "system" circuit board in an effort to use them to perform unauthorized decryption of data streams, the removed IC somehow detects this change in its environment and precludes such activities. The present invention provides a way to generate such a "signature" associated with the system, which then can be written into a secure smart card or other type of secure memory. If the smart card/system combination changes, the signatures will no longer match, and the verifier software can now take appropriate action.

In accordance with the present invention, this may be accomplished in the IC by looking at normal manufacturing tolerances in two components that are normally connected to or associated with the device.

Figure 2:
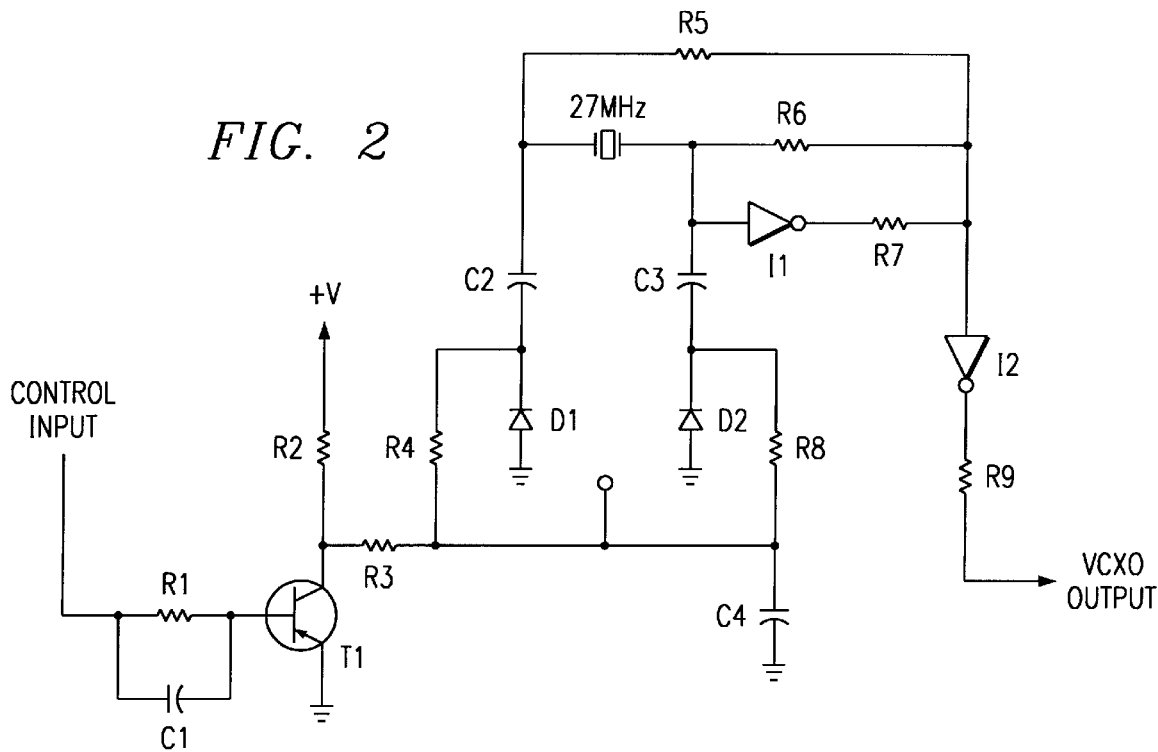
FIG. 2 depicts a representative VCXO circuit.

As part of the normal decoding process, some ICs 42, 46 have to synthesize a number of discrete frequencies. Similarly, CPU 32 may generate or synthesize a number of discrete frequencies. For a settop box, one of these frequencies or clocks is the 27 MHz video master clock; this clock may be derived by phase locking a VCXO (voltage controlled crystal oscillator) to the System Clock Reference data that is in the incoming video bitstream. This will, in effect, reproduce the exact frequency of the master clock that was used in the encoder system. This clock may then be used to derive other internal or external working clocks. FIG. 2 depicts a representative VCXO circuit for a 27 MHz crystal.

For a settop box, a second clock that may be used is the one used to output the decoded audio or drive the CPU. For audio, this clock also has to exactly match the clock used when the audio was encoded, and it does not bear any simple relationship to the previously described 27 MHz clock. Although not required, this second clock is preferably much more precise and jitter free. This second clock is derived independently, but in a similar fashion as the first clock. That is, a second external VCXO is phase locked by an IC to time stamps embedded in the audio stream or some other source. Again, one or more CPU clocks may be so employed.

In both of these systems, the VCXO crystal is typically external, but the control circuitry is internal to the IC. Clearly, other such arrangements are possible and are contemplated by the present invention.

Now, if one of these controlled oscillators are "unlocked", they will settle at a free running frequency dependent on a combination of component tolerances—crystal, voltage, variable capacitance, diodes, loading and trimming capacitors and resistors (most of these components are depicted in FIG. 2). Furthermore, the oscillators can be forced to two discrete free-running frequencies—one at the maximum and one at the minimum control limits. Since the oscillators normally operate in a closed loop mode, the crystals do not have to be very accurate, and therefore are cheaper. The board manufacturer will normally use the widest tolerance—e.g. cheapest—crystal that will still work, giving an additional advantage to this method.

Having these two open loop frequencies allows, at reset or other selected times, a calibration routine to be performed where one of the clocks is used as the reference, and measures the frequency of the other clock. Moving the IC or chip from one system board to another will give a different result, as the statistical probability that four free running oscillators (two in the old system board, two in the new system board) are identical is very low.

Figure 6:
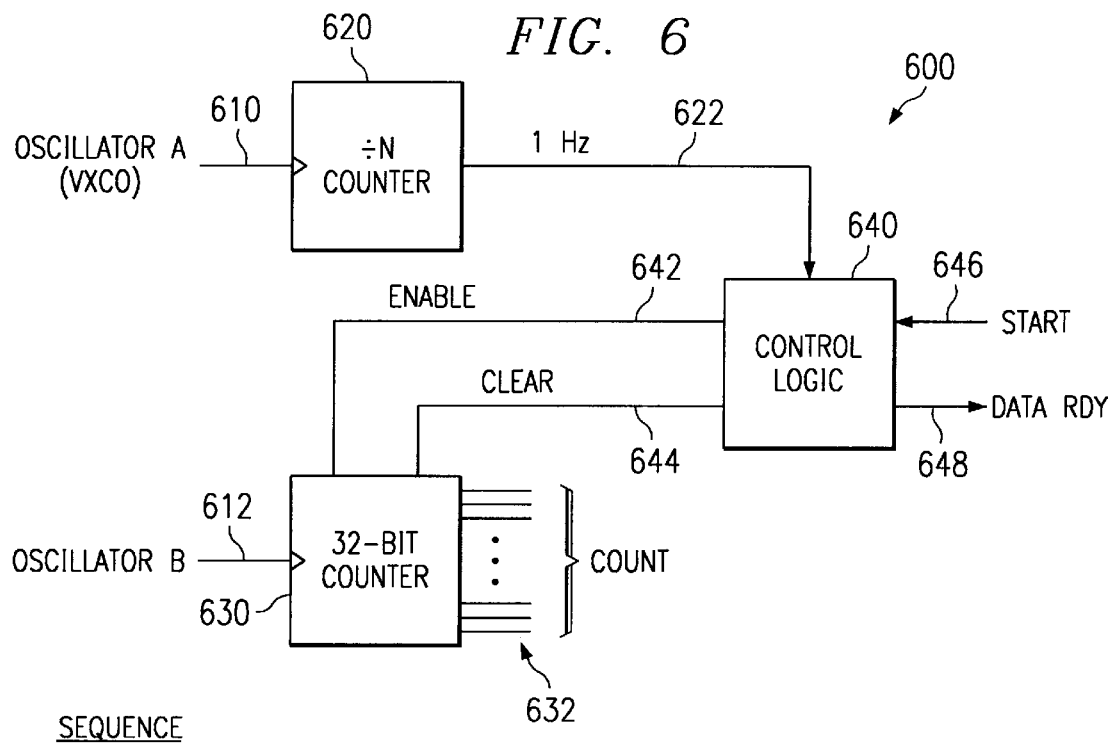
FIG. 6 depicts a representative circuit for determining a frequency count.

This measurement may be done a variety of ways—one way may be by using any internal processor (CPU 32), whose clock may be derived from one of the oscillators, to count a scaled output of the second oscillator. Alternatively, the second oscillator may be used to count the number of no-ops the CPU can perform in a certain time period, such as one second. Another way to perform this measurement is to use a gated counter, where the scaled output of one of the oscillators would act as the gate into a counter counting the output of the second oscillator, such as depicted in FIG. 6.

Once this "magic number" is determined, it is a "signature" of the system and needs to be stored somewhere in a non-volatile memory. There are a number of options, such as, for example, but not limited to:

Store it in the system EEPROM on the system board
Store it in a Smart Card
Store it in a small, dedicated EEPROM on the system board Of the above, there are pros and cons for all three, but the method of storage is not critical for the invention. However, it may be very important from an application and security standpoint.

In more detail, a first VCXO is preferably a portion of, or on, the integrated circuit ("IC") whose environment is to be monitored. A second VCXO may be mounted on the system board on which the IC is mounted, or may be on the IC itself.

Normally these VCXOs are controlled by phase locked loop (PLL) circuitry that adjusts the frequency of the PLL to run at a specific frequency derived from an incoming data stream. However, for purposes of the present invention either of the VCXOs may be allowed to be free running. In this free running mode of operation, the PLL circuitry may be controlled in a first preselected manner to drive its frequency to some maximum or highest frequency. In a similar manner, the PLL circuitry may be controlled in a second preselected manner to drive its frequency to some minimum or lowest frequency.

According to the present invention, one of the two VCXOs (hereinafter the "first VCXO") is driven to its highest frequency. The other VCXO (hereinafter the "second VCXO") is run in its PLL mode at some arbitrary but fixed and stable frequency. The second VCXO is then used to count the frequency pulses from the first VCXO for a preselected but fixed period of time. This generates or results in a first frequency count number.

The first VCXO is then driven to its lowest frequency. The second VCXO is then used to count the frequency pulses from the first VCXO for the same preselected but fixed period of time. This generates or results in a second frequency count number.

Preferably, these two frequency count numbers are averaged to provide an average frequency count number. This average frequency count number is also preferably adjusted to reduce the number of bits or magnitude using modulo arithmetic. This adjusted average frequency count number is then stored in a memory location. This stored value becomes the original value which is then compared to a currently calculated value to determine if the IC has been moved or altered in any way from the environment of the system in which the original value was determined.

Although initially described hereinabove as driving the first VCXO to its highest frequency and then its lowest frequency, clearly, these two steps may be reversed and still be within the scope of the present invention. In a similar manner, the two VCXOs may be on, or a portion of, the IC, or one VCXO may be on the IC and the other VXCO on a system level board to which the IC is attached, and still be within the scope of the present invention. When the VCXOs are on the IC and a system level board, preferably the first VCXO is on the IC.

The first VCXO is preferably a portion of the integrated circuit ("IC") for which a unique electronic signature is to be generated. A second VCXO may be mounted on the system board on which the IC is mounted or may be on the IC itself.

According to the present invention, one of the two VCXOs (hereinafter the "first VCXO") is driven to its highest or lowest frequency. The other VCXO (hereinafter the "second VCXO") is run in its PLL mode at some arbitrary but fixed and stable frequency. The second VCXO is then used to count the frequency pulses from the first VCXO for a preselected but fixed period of time. This generates or results in a frequency count number that serves as the unique electronic signature.

This frequency count number may preferably also be adjusted or modified to reduce the number of bits or magnitude using modulo arithmetic.

For the rest of this discussion, the "magic number" will be stored in a Smart Card, although clearly other memory locations may be so employed and still be within the scope of the present invention. FIG. 1 does not depict the use of a Smart Card. For the FIG. 1 system, such a Smart Card could be inserted into a Smart Card interface which could be interconnected with IC 30.

Using the assumption that a Smart Card is employed, the sequence of events that preferably happen is as follows:

First, a dedicated 16-bit location "AAAA" in the Smart Card memory should be pre-programmed with a initial value of "XYXY". The actual number is immaterial, and is the same in all new Smart Cards.

Figure 3:
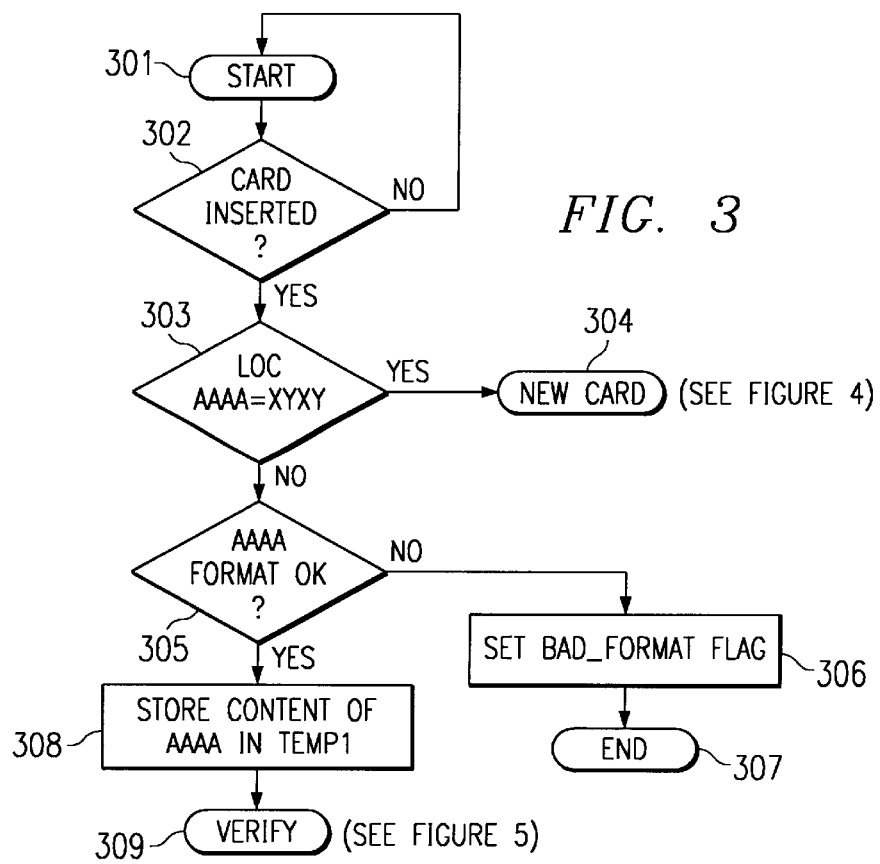
FIG. 3 depicts a flow diagram for a smart card employing the method of the present invention.

During the power-on, reset, or other specified command or operation, the chip on a system level board will perform, or cause to be performed, the sequence of operations depicted in FIG. 3. More particularly, as depicted in FIG. 3, the IC 30 will initialize in a "START" mode 301. The IC 30 then determines if there is a Smart Card present. 302 This may involve some sort of system level request by the IC 30 or CPU 32 performing these steps to make this determination. If no smart card is present, the operation returns to START 301.

The IC 30 then determines if location "AAAA" in the Smart Card memory, or other secure memory location, contains "XYXY". 303 If the Smart Card memory, or other secure memory location, contains "XYXY", then the operation shifts to NEW CARD 304 operation, described hereinbelow. Otherwise the operation shifts to a determination of whether location "AAAA" in the Smart Card memory, or other secure memory location, contains a value in the proper format. 305 If the memory location does not contain a value in the proper format the operation shifts to BAD_CARD Operation 306.

BAD_CARD Operation 306 sets a BAD_FORMAT flag 306 and then goes to END 307. If the memory location contains a value in the proper format the operation reads location "AAAA" in the Smart Card memory, or other secure memory location, and stores that value in a memory 36 location "TEMP1" 308. After that the operation shifts to the VERIFY 309 procedure, described hereinbelow.

Figure 4:
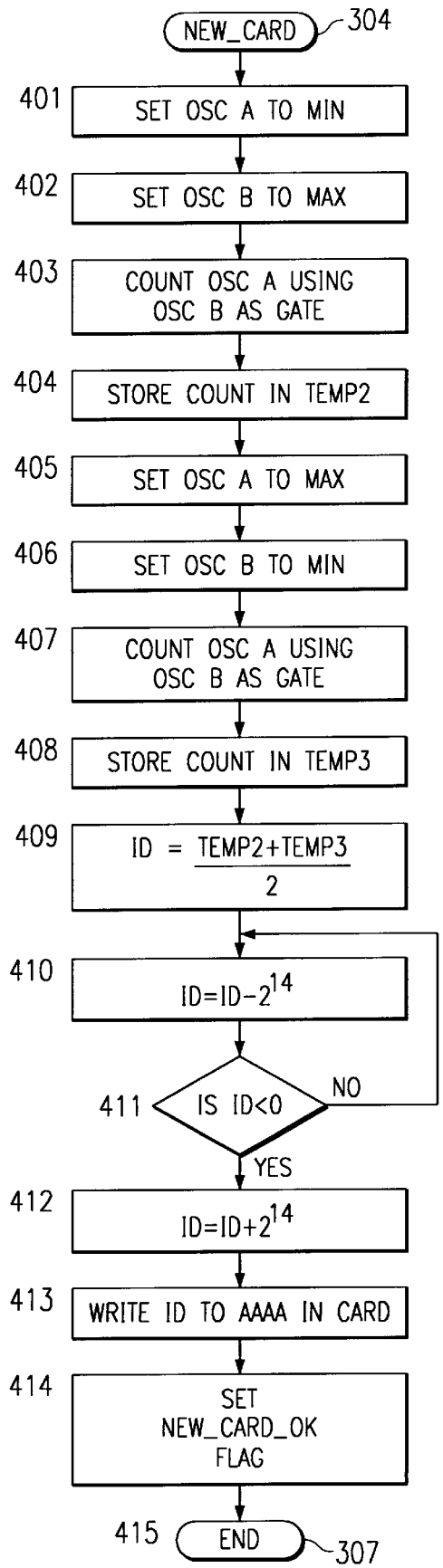
FIG. 4 depicts a flow diagram that forms a portion of FIG. 3.

More particularly, as depicted in FIG. 4, the IC 30 NEW CARD 304 operations are as follows. First the first oscillator ("A") is forced to its lowest free running frequency 401. Then the second oscillator ("B") is forced to its highest free running frequency 402. Then oscillator B is used as a time reference to count oscillator A's frequency for a time period "C" 403. The resulting frequency count is then stored in a memory location "TEMP2" 404. Next oscillator A is forced to its highest free running frequency 405. Then oscillator B is forced to its lowest free running frequency 406. Then oscillator B is again used as a time reference to count oscillator A's frequency for the time period C 407. The resulting frequency count is then stored in a memory location "TEMP3" 408.

Figure 5:
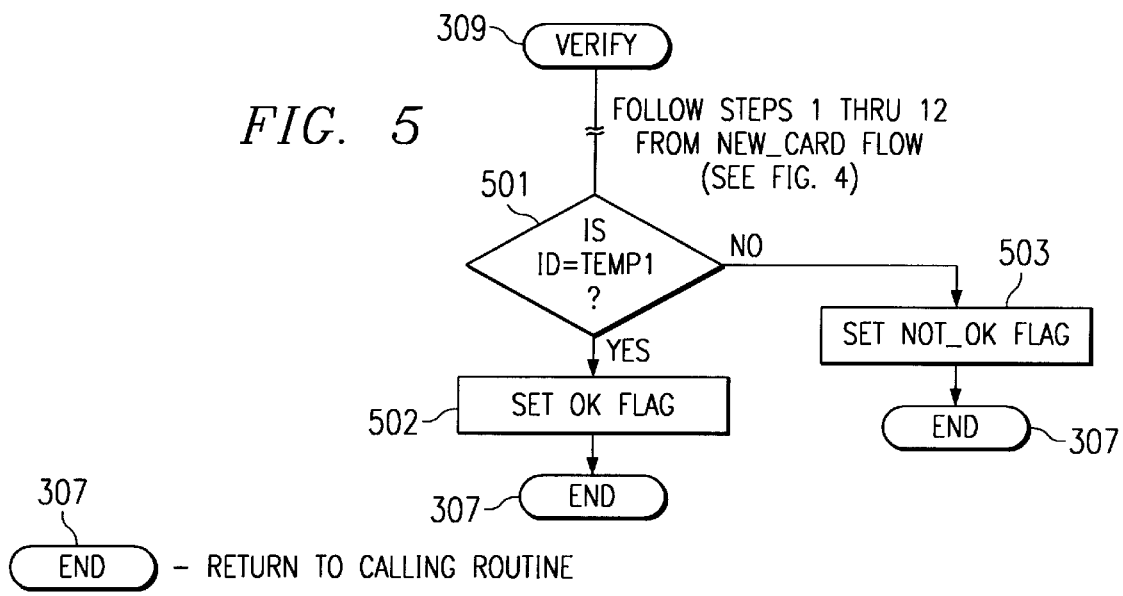
FIG. 5 depicts a flow diagram that forms a portion of FIG. 3.

Next an average of the counts stored in TEMP2 and TEMP3 is calculated, yielding a value "ID" 409. Following this, ID is reduced to 14-bit magnitude using modulo arithmetic 410–412. Then ID is written to a memory location "AAAA" in the Smart Card, or other secure memory location, with any unused locations padded with 0s 413. Then a NEW_CARD_OK flag is set 414. The operation then shifts to END 415/307. As depicted in FIG. 5, END 307 returns to the routine or operation that called the procedures of FIG. 3.

More particularly, as depicted in FIG. 4, the IC 30 VERIFY 309 operations are as follows. First the steps 1 through 12 of the NEW_CARD routine 304 are performed. Then the generated ID is compared to value previously stored in a memory location "TEMP1" 501. If the two values ID and TEMP1 are equal, an OK flag is set 502 and the operation shifts to END 307. If the two values ID and TEMP1 are not equal, a NOT_OK flag is set 503 and the operation shifts to END 307.

The time period C should be selected to give a large count, preferably in the 27 to 32 bit range. Although the foregoing "NEW CARD" process or routine uses two counts, the use of only one count (without any averaging) is also clearly within the scope of the present invention.

Reducing the final count or ID to 14-bits magnitude using modulo arithmetic 410–412 is given as an example; other methods and accuracies may be just as acceptable. The purpose is to reduce the number of significant bits to eliminate small temperature and/or aging effects on the components used in the oscillators. As an alternate approach, the raw ID may be stored in the Smart Card in a 32-bit location, and the range reduction performed as part of the VERIFY routine.

The sequence of forcing Oscillators A and B to the lowest and highest free running frequency is also given as an example, other combinations may be used as well. The purpose is to improve the accuracy of the measurement.

The calling routine, usually the power-on reset function, should determine what to do upon return, depending on the state of the flags and on security requirements. FIG. 6 depicts a representative circuit 600 for determining a frequency count. In accordance with the present invention, this may be accomplished when an IC 30 employs a gated counter 630. More particularly, the scaled output of one of the oscillators 610 acts as the gate 622 into a counter 630 counting the output of the second oscillator 612. More particularly, START 646 is dropped to reset the circuit 600 and clear the counters 620, 630. START 646 is raised to enable 642 the 32-bit counter 630. The counter 630 starts counting the frequency of oscillator B 612 on the next low to high transition of the 1 Hz gating signal 622. The counter 630 stops counting the frequency of oscillator B 612 on the next high to low transition of the 1 Hz gating signal 622. The DATA RDY 648 (data ready) line goes "active", to signal the completion of the count and its availability at lines 632. A simple control logic block 640 provides the appropriate control signals to counter 630 (and counter 620) for these operations.

While the invention has been described with reference to illustrative embodiments, this description is not intended to be construed in a limiting sense. Various other embodiments of the invention will become apparent to persons skilled in the art upon reference to this description. It is therefore contemplated that the appended claims will cover any such modifications of the embodiments as fall within the true scope and spirit of the invention.

What is claimed is:

1. A method for determining if a system in which an integrated circuit is operating has been altered, changed or modified, comprising:

providing a first voltage controlled crystal oscillator ("VCXO") as part of said integrated circuit, providing a second VCXO as part of said system or said integrated circuit, adjusting one of said VCXOs in a first preselected manner, determining a first frequency count of said adjusted VCXO during a first preselected time interval determined by said other VCXO, and comparing said frequency count to a previously stored, determined or provided frequency count to determine if said system in which said circuit is operating has been altered, changed or modified.

2. The method of claim 1, wherein said determining step includes monitoring output cycles of said adjusted VCXO and determining how many of said adjusted VCXO output cycles occur during the time interval.

3. The method of claim 1, including defining the time interval, said defining step including monitoring output cycles of said other VCXO, ascertaining a period of time occupied by a predetermined number of consecutive output cycles of said other VCXO, and using said ascertained period of time as the time interval.

4. The method of claim 3, wherein said ascertaining step includes producing a first indication of a beginning of said period of time, counting a predetermined number of consecutive output cycles of said other VCXO that occur immediately after said first indication and, when said counting step reaches said predetermined number, providing a second indication of an end of said period of time.

5. The method of claim 4, wherein said determining step includes monitoring output cycles of said adjusted VCXO and determining how many of said adjusted VCXO output cycles occur between said first indication and said second indication.

6. The method of claim 3, wherein said ascertaining step includes dividing the output of said other VCXO.

7. A method for determining if an environment in which an integrated circuit operates has been modified, comprising:

providing a first voltage controlled crystal oscillator ("VCXO") as part of said integrated circuit, providing a second VCXO as part of said environment or said integrated circuit, adjusting one of said VCXOs in a first preselected manner, determining a first frequency count of said adjusted VCXO during a first preselected time interval determined by said other VCXO, adjusting said one of said VCXOs in a second preselected manner, determining a second frequency count of said adjusted VCXO during said first preselected time interval determined by said other VCXO, averaging said first and second frequency count to provide an average frequency count, adjusting said average frequency count in a predetermined manner, and comparing said adjusted average frequency count to a previously determined average frequency count to determine if said environment in which said circuit operates has been modified.

8. The method of claim 7, wherein said determining steps include monitoring output cycles of said adjusted VCXO and determining how many of said adjusted VCXO output cycles occur during the time interval.

9. The method of claim 7, including defining the time interval, said defining step including monitoring output cycles of said other VCXO, ascertaining a period of time occupied by a predetermined number of consecutive output cycles of said other VCXO, and using said ascertained period of time as the time interval.

10. The method of claim 9, wherein said ascertaining step includes producing a first indication of a beginning of said period of time, counting a predetermined number of consecutive output cycles of said other VCXO that occur immediately after said first indication and, when said counting step reaches said predetermined number, providing a second indication of an end of said period of time.

11. The method of claim 10, wherein said determining steps include monitoring output cycles of said adjusted VCXO and determining how many of said adjusted VCXO output cycles occur between said first indication and said second indication.

12. The method of claim 9, wherein said ascertaining step includes dividing the output of said other VCXO.

13. A method for generating a unique electronic signature for an integrated circuit, comprising:

provide a first voltage controlled crustal oscillator ("VCXO") as part of said integrated circuit, providing a second VCXO as a part of said integrated circuit or an external circuit associated with said integrated circuit, adjusting one of said VCXOs in preselected manner, and determining a unique electronic characteristic from said adjusted VCXO during a preselected time interval determined by said other VCXO.

14. The method of claim 13, including defining the time interval, said defining step including monitoring output cycles of said other VCXO, ascertaining a period of time occupied by a predetermined number of consecutive output cycles of said other VCXO, and using said ascertained period of time as the time interval.

15. The method of claim 14, wherein said ascertaining step includes producing a first indication of a beginning of said period of time, counting a predetermined number of consecutive output cycles of said other VCXO that occur immediately after said first indication and, when said counting step reaches said predetermined number, providing a second indication of an end of said period of time.

16. The method of claim 14, wherein said ascertaining step includes dividing the output of said other VCXO.

17. Circuitry for generating a unique electronic signature for an integrated circuit, comprising:

a first voltage controlled crystal oscillator (VCXO) which is a portion of said integrated circuit;

a second VCXO which is a portion of said integrated circuit or an external circuit associated with said integrated circuit;

a counter coupled to said first VCXO for producing a frequency count of said first VCXO by counting output cycles of said first VCXO; and said counter also coupled to said second VCXO and responsive to output cycles produced by said second VCXO for counting a number of output cycles of said first VCXO that occur during a time interval derived from said output cycles of said second VCXO.

18. The circuitry of claim 17, including a further counter coupled to said second VCXO for deriving said time interval by counting a predetermined number of consecutive output cycles of said second VCXO, said further counter having an output coupled to said first-mentioned counter for indicating when said predetermined number of output cycles of said second VCXO have been counted.

19. The circuitry of claim 18, wherein said further counter includes a divider circuit.

* * * * *